(12) United States Patent
Paul (10) Patent No.: US 12,136,926 B2
(45) Date of Patent: Nov. 5, 2024

(54) TWO POINT FREQUENCY SEARCH BASED PLL CONTROL

(71) Applicant: TEXAS INSTRUMENTS INCORPORATED, Dallas, TX (US)

(72) Inventor: Animesh Paul, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 44 days.

(21) Appl. No.: 17/992,701

(22) Filed: Nov. 22, 2022

(65) Prior Publication Data

US 2024/0137028 A1 Apr. 25, 2024

Related U.S. Application Data

(60) Provisional application No. 63/418,339, filed on Oct. 21, 2022.

(51) Int. Cl.
*H03L 7/087* (2006.01)
*H03L 7/093* (2006.01)
*H03L 7/099* (2006.01)

(52) U.S. Cl.
CPC .............. *H03L 7/087* (2013.01); *H03L 7/093* (2013.01); *H03L 7/0991* (2013.01)

(58) Field of Classification Search
CPC ..................................................... H03L 7/087
USPC ........................................................ 331/1 R
See application file for complete search history.

(56) References Cited

U.S. PATENT DOCUMENTS

2011/0260763 A1* 10/2011 Wang ...................... H03L 7/099
327/157
2021/0013891 A1* 1/2021 Wicpalek ................ H03L 1/022

OTHER PUBLICATIONS

Liu, Jenlung et al., IEEE Asian Solid-State Circuits Conference, A 0.8V, Sub-mW, Varactor-Tuning Ring-Oscillator-Based Clock Generator in 32nm CMOS, Nov. 14-16, 2011, Jeju, Korea, pp. 337-340.

* cited by examiner

*Primary Examiner* — Joseph Chang
(74) *Attorney, Agent, or Firm* — Mandy Barsilai Fernandez; Frank D. Cimino (57) ABSTRACT

In an example, a phase-locked loop (PLL) circuit includes an oscillator, a frequency search circuit, and an analog control loop. The oscillator is configured to provide a clock signal. The frequency search circuit is configured to measure a first frequency of the clock signal for a first clock control signal, measure a second frequency of a second signal for a second clock control signal, and determine, based on the first frequency, the second frequency, the first clock control signal, and the second clock control signal, a third clock control signal corresponding to a programmed frequency, the third clock control signal for causing the clock signal to have a frequency based on the programmed frequency. The analog control loop is configured to control the oscillator to cause the frequency to converge to the programmed frequency.

20 Claims, 6 Drawing Sheets

TWO POINT FREQUENCY SEARCH BASED PLL CONTROL

CROSS-REFERENCE TO RELATED APPLICATIONS

The present application claims priority to U.S. Provisional Patent Application No. 63/418,339, which was filed Oct. 21, 2022, is titled "TWO POINT FREQUENCY SEARCH BASED PLL CONTROL," and is hereby incorporated herein by reference in its entirety.

BACKGROUND

A phase-locked loop (PLL) is a circuit that provides an output signal having a phase related to a phase of an input signal of the PLL. The phase of the output signal having a relationship to the phase of the input signal causes a frequency of the output signal to have a relationship to a frequency of the input signal. For example, the output frequency is a multiple of the input frequency.

SUMMARY

In an example, a phase-locked loop (PLL) circuit includes an oscillator, a frequency search circuit, and an analog control loop. The oscillator is configured to provide a clock signal. The frequency search circuit is configured to measure a first frequency of the clock signal for a first clock control signal, measure a second frequency of a second signal for a second clock control signal, and determine, based on the first frequency, the second frequency, the first clock control signal, and the second clock control signal, a third clock control signal corresponding to a programmed frequency, the third clock control signal for causing the clock signal to have a frequency based on the programmed frequency. The analog control loop is configured to control the oscillator to cause the frequency to converge to the programmed frequency.

In an example, an apparatus includes a counter, a first register, a second register, a calculation circuit, a third register, a fourth register, an addition circuit, and a multiplexer. The counter has a reference input, a clock input, and a counter output. The counter is configured to count a number of rising edges occurring in a clock signal received at the clock input for a programmed number of cycles of a reference clock received at the reference input. The first register has a first register input and a first register output, the first register input coupled to the counter output. The first register is configured to store a first output value of the counter. The second register has a second register input and a second register output, the second register input coupled to the counter output. The second register is configured to store a second output value of the counter. The calculation circuit has a first operand input, a second operand input, a calculation output, and a status output, the first operand input coupled to the first register output, and the second operand input coupled to the second register output. The calculation circuit is configured to provide a control signal having a value determined based on the first output value and the second output value, the control signal to control an oscillator to provide the clock signal having a frequency within a margin of error of a programmed value. The third register has a third register output. The fourth register has a fourth register output. The addition circuit has a first addition input, a second addition input, and an addition output, the first addition input coupled to the third register output, and the second addition input coupled to the fourth register output. The multiplexer has a first multiplexer input, a second multiplexer input, a selection input, and a multiplexer output, the first multiplexer input coupled to the addition output, the second multiplexer input coupled to the calculation output, and the selection input coupled to the status output.

In an example, a method includes performing open loop control of an oscillator providing a clock signal by measuring a first frequency of the clock signal provided by the oscillator responsive to a first clock control code, measuring a second frequency of the clock signal provided by the oscillator responsive to a second clock control code, determining, based on the first frequency, the second frequency, the first clock control code, and the second clock control code, a third clock control code for controlling the oscillator, the third clock control code corresponding to a programmed frequency for the clock signal, and controlling the oscillator to provide the clock signal at a third frequency according to the third clock control signal. The method also includes performing closed loop control of the oscillator providing the clock signal by converging the third frequency to the programmed frequency based on a comparison of a signal representative of the frequency to a signal representative of the programmed frequency.

BRIEF DESCRIPTION OF THE DRAWINGS

The same reference numbers or other reference designators are used in the drawings to designate the same or similar (functionally and/or structurally) features.

DETAILED DESCRIPTION

A PLL may be useful in various circuits, systems, or devices in which signal synchronization is useful. For example, a PLL may be useful in clock synchronization, demodulation, frequency generation, or other use cases in application environments such as communications, digital device control (e.g., clock generation), etc. Based on a frequency (F_IN) of a received signal, such as a reference clock (CLK_IN) or other reference signal, the PLL provides an output signal (CLK_PLL) having a frequency (F_PLL) that is a multiple of the F_IN.

In some systems or devices, other components are dependent on CLK_PLL for operation. Thus, at startup of the system, the other components may not be in operational states until CLK_PLL is received, or until a threshold amount of time after CLK_PLL is received. As such, an amount of time consumed by the PLL in determining and providing CLK_PLL may be a limiting factor in a startup time of the system. The amount of time consumed by the PLL may be referred to as a settling time, such as an amount of time for CLK_PLL to settle to a value based on CLK_IN.

In some PLL architectures, this settling time is 180 microseconds, 200 microseconds, or longer.

This description includes various examples of a PLL that includes both digital and analog control to mitigate the settling time challenges described above. The digital control may estimate a control value for providing CLK_PLL, where CLK_PLL provided according to the digital control may have properties (frequency, phase, and/or duty cycle, etc.) within a threshold frequency variance of a target behavior for CLK_PLL based on CLK_IN. In some examples, the threshold frequency variance is no greater than approximately 25%. In some examples, the threshold frequency variance is no greater than approximately 12.5%. The analog control may converge CLK_PLL (e.g., settle CLK_PLL) to a final output oscillation such that it has a programmed relationship to CLK_IN. In an example, the digital control is implemented by performing a two point frequency search. For example, a first value of F_PLL is determined based on control of the PLL according to a first control signal, and a second value of F_PLL is determined based on control of the PLL according to a second control signal. Based on the first and second control values of F_PLL, a slope is determined. The slope defines the linear relationship of the PLL between a control code and F_PLL. Based on the slope, for a target or programmed value for F_PLL, an estimated control signal may be determined. The value of F_PLL provided by the PLL according to the estimated control signal is, in some examples, within the threshold frequency variance of the target or programmed value for F_PLL. Responsive to the determination of the estimated control signal, the PLL converges F_PLL to the target or programmed value for F_PLL according to analog control. In various examples, such a hybrid digital estimation and control (e.g., open loop control) and analog control (e.g., closed loop control) of the PLL reduces the settling time of the PLL to approximately 10 microseconds, approximately 7 microseconds, approximately 5 microseconds, approximately 3 microseconds, or less, based on an architecture with which the PLL is implemented. In an example, the settling time of the PLL decreases as the threshold frequency variance decreases. For example, for a threshold frequency variance of no greater than 12.5%, as described herein, the settling time of the PLL may be less than the settling time of a PLL for which the threshold frequency variance is greater than 12.5%.

Figure 1:
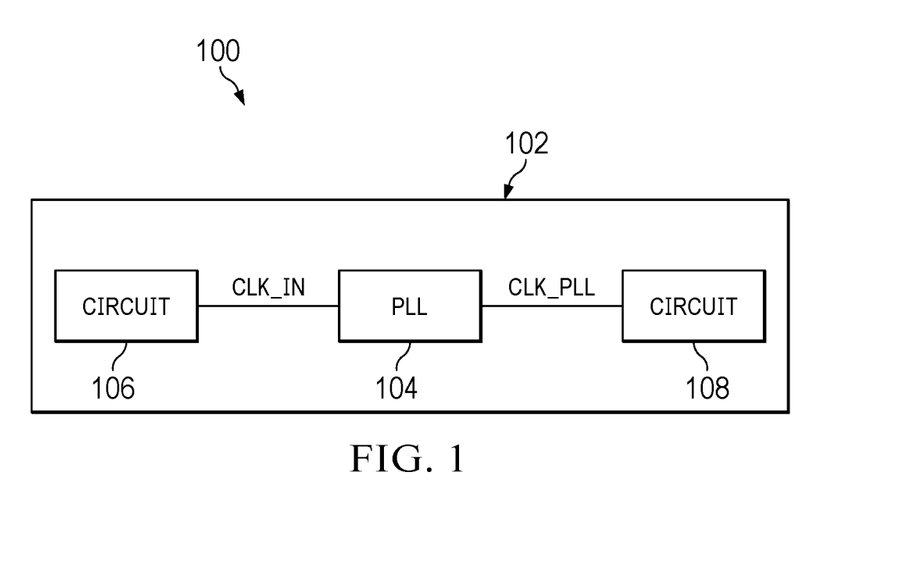
FIG. 1 is a block diagram of a system, in accordance with various examples.

FIG. 1 is a block diagram of a system 100 in accordance with various examples. In some implementations, the system 100 may benefit from implementation of a PLL. As such, the system 100 includes a device 102 which includes a PLL 104, a circuit 106, and a circuit 108. The device 102 may be any suitable device, such as a computer system, a router, a smartphone, a wearable device, an audio and/or video device, a component of transportation vehicle, etc., which may benefit from a PLL as described herein, such as the PLL 104. The PLL 104 may be implemented according to any suitable technology including analog and/or digital components and may be implemented in a single integrated circuit or multiple integrated circuits coupled together. Further, the PLL 104 may be implemented on a same integrated circuit as at least some components of other circuits, such as the circuit 106, the circuit 108, and/or other circuits not shown in FIG. 1. The circuit 106 provides CLK_IN to the PLL 104. In some examples, CLK_IN is received by the circuit 106 as input from another component or provided by a user and, in turn, the circuit 106 provides CLK_IN to the PLL 104. In other examples, CLK_IN is generated or otherwise provided by the circuit 106 based on one or more other signals which may be received by the system 100 from a user and/or generated by the system 100. For example, the circuit 106 may include or be coupled to an oscillator (not shown), such as a crystal oscillator, configured to provide CLK_IN. The circuit 106 may be implemented according to any suitable technology including analog and/or digital components and may include, for example, a processor, a state machine, logic circuitry, digital circuitry, memory, analog circuitry, software and/or any combination thereof suitable for performing at least the operations or functions attributed to the circuit 106 herein. The circuit 108 receives an output signal (CLK_PLL) of the PLL 104. In some examples, the circuit 108 operates at least partially according to CLK_PLL (e.g., may be clocked according to CLK_PLL, synchronizes or otherwise processes another signal based on CLK_PLL, etc.). As described herein, CLK_PLL has a frequency F_PLL, which has a relationship, such as an integer relationship, to F_IN (which, for example, is the frequency of the received clock signal, CLK_IN). As used herein, an integer relationship between two values means that one of the values is multiplied by an integer to obtain the other value, or that one of the values is divided by an integer to obtain the other value. The circuit 108 may be implemented according to any suitable technology including analog and/or or digital components and may include, for example, a processor, a state machine, logic circuitry, digital circuitry, memory, analog circuitry, software and/or any combination thereof suitable for performing at least the operations or functions attributed to the circuit 108 herein.

The PLL 104 may include multiple control methodologies, such as open-loop digital control and closed-loop analog control. Via the digital control, the PLL 104 may estimate a control value for controlling an oscillator (not shown) within the PLL 104 to provide CLK_PLL having F_PLL. As described above, F_PLL, as provided under digital control, may have a value within a threshold frequency variance of a programmed or target value for F_PLL. Via the analog control, the PLL 104 may modify CLK_PLL to converge the value of F_PLL to be equal to the programmed or target value for F_PLL. As used herein, the value of F_PLL equaling the programmed or target value for F_PLL includes the value of F_PLL being within 1%, 0.75%, 0.5%, 0.25%, 0.15%, 0.1%, or 0.05% of the programmed or target value for F_PLL.

In an example, the oscillator of the PLL 104 has an approximately linear relationship between the value of a control code and F_PLL. As used herein, a control code is a digital value having multiple bits. A length of the control code (e.g., a number of bits) may be any suitable value providing for a target performance of the PLL 104 in terms of accuracy, speed, or any other observable metric. In an example, the control code has 10 bits. Because of the linear nature of operation of the oscillator, a value of F_PLL may become predictable if the linear relationship, or an approximation of the linear relationship, is determined. To provide the digital control, the PLL 104 may perform a two point frequency search. For example, the PLL 104 may determine a first value for F_PLL based on controlling the oscillator according to a first control code and determine a second value for F_PLL based on controlling the oscillator according to a second control code. Based on the first and second values for F_PLL, the PLL 104 may determine a slope of a line on which both the first and second values for F_PLL lie. Based on this slope, an estimated control code for the programmed or target value of F_PLL may be determined, and the oscillator may be controlled to provide CLK_PLL according to the estimated control code.

During determination of the estimated control code, the analog control of the oscillator may be disabled, or may be held to a fixed bias level. Responsive to determination of the estimated control code, the analog control of the PLL 104 may be enabled. In an example, to perform the analog control the PLL 104 receives CLK_IN and manipulates CLK_IN to form a signal CLK_REF having frequency F_ref. F_ref has an integer relationship to F_IN. For example, the PLL 104 divides CLK_IN to form CLK_REF such that F_ref is a fraction of F_IN. The PLL 104 compares a frequency and phase of CLK_REF to a frequency and phase of a feedback signal having an integer relationship to CLK_PLL. In some examples, the feedback signal is produced by dividing down CLK_PLL. Based on the comparison, the PLL 104 provides an analog control signal for controlling the oscillator. The PLL 104 further controls the oscillator (that is already providing CLK_PLL according to the control code) based on the analog control signal to provide CLK_PLL and converge F_PLL to the programmed or target value. In some examples, the PLL 104 further manipulates (e.g., multiplies or divides) the output signal of the oscillator prior to providing that manipulated signal as CLK_PLL.

Figure 2:
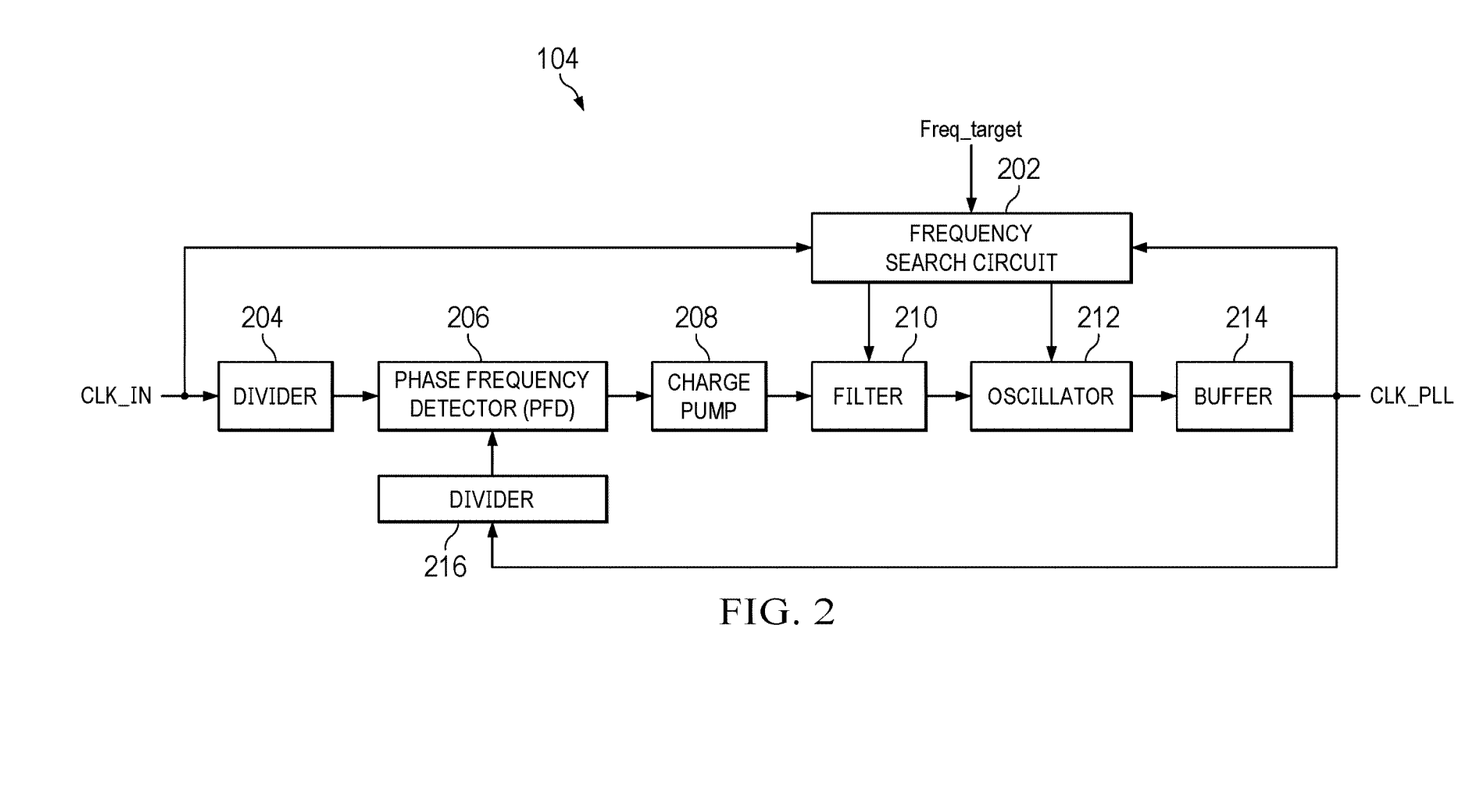
FIG. 2 is a block diagram of a PLL, in accordance with various examples.

FIG. 2 is a block diagram of the PLL 104, in accordance with various examples. The PLL 104 includes a frequency search circuit 202, a divider 204, a phase frequency detector (PFD) 206, a charge pump 208, a filter 210, an oscillator 212, a buffer 214, and a divider 216. In an example, the frequency search circuit 202 may be referred to as a digital control portion of the PLL 104 and the divider 204, PFD 206, charge pump 208, filter 210, and divider 216 may be collectively referred to as an analog control loop. The divider 204 and divider 216 may be of any suitable technology including digital and/or analog components operable to divide a signal, such as to reduce a frequency of an output signal of the divider with respect to a frequency of an input signal received by the divider. Each of the divider 204 and the divider 216 may divide their respective input signals to provide their respective output signals according to any suitable value, which may be the same for the divider 204 and the divider 216 or may be different, the scope of which is not limited herein. The PFD 206 may be of any suitable technology including digital and/or analog components operable to receive multiple signals and compare frequency and/or phase values of the signals to determine an output value. The charge pump 208 may be of any suitable technology including digital and/or analog components operable to provide a signal having a voltage determined based on a value of a received input signal, such as a signal received from the PFD 206. The filter 210 may be of any suitable technology including digital and/or analog components operable to signal filtering. In an example, the filter 210 is a low-pass filter (such as a resistor-capacitor (RC) filter). In some examples, the filter 210 is further capable of providing a fixed bias voltage, to the oscillator 212, such as a bias voltage determined as an output of a voltage divider coupled between a power source (not shown) and ground. In an example, the oscillator 212 is a voltage controlled oscillator, such as a ring oscillator, that is suitable for accepting hybrid control (e.g., control according to a digital code and according to an analog signal). The hybrid control is, for example, digital and analog control, such as digital control for providing coarse control of the oscillator 212 and analog control for providing fine control of the oscillator 212. As such, the oscillator 212 may be suitable for providing CLK_PLL exclusively according to digital control, exclusively according to analog control, or according to both digital control and analog control simultaneously. The buffer 214 may be of any suitable technology including digital and/or analog components operable to buffer a signal, such as back to back digital logic NOT gates, a unity-gain amplifier, a current mirror, or the like.

In an example architecture of the PLL 104, the frequency search circuit 202 has a first input configured to receive CLK_IN, a second input coupled to an output of the buffer 214, a first output coupled to the filter 210, and a second output coupled to the oscillator 212. Although shown as a single coupling, in some examples the second output of the frequency search circuit 202 includes multiple discrete couplings to the oscillator 212 such that individual binary data bits are provided via each of these couplings (e.g., a first bit is provided via a first coupling, a second bit is provided via a second coupling, etc.). The divider 204 has an input configured to receive CLK_IN (e.g., coupled to the input of the frequency search circuit 202) and an output. The PFD 206 has a first input coupled to the output of the divider 204, a second input coupled to an output of the divider 216, and an output. The charge pump 208 has an input coupled to the output of the PFD 206 and an output. The filter 210 has an input coupled to the output of the PFD 206, a second input coupled to the first output of the frequency search circuit 202, and an output. The oscillator 212 has a first input coupled to the second output of the frequency search circuit 202, a second input coupled to the output of the filter 210, and an output. The buffer 214 has an input coupled to the output of the oscillator 212 and an output coupled to the second input of the frequency search circuit 202. In an examples, CLK_PLL is provided at the output of the buffer 214. The divider 216 has an input coupled to the output of the buffer 214 and an output coupled to the second input of the PFD 206.

In an example, the second input of the filter 210 is an enable input such that the filter 210 is disabled, or provides a fixed bias voltage, responsive to receipt at the second input of a signal having an asserted value, and is enabled responsive to receipt at the second input of a signal having a deasserted value. Although not shown, in some examples, the divider 204, PFD 206, charge pump 208, divider 216, or any combination thereof may also include enable inputs coupled to the second output of the frequency search circuit 202. Inclusion of the enable inputs may reduce power consumption of the PLL 104, such as by facilitating the disabling of the PFD 206, charge pump 208, and at least partial disabling of the filter 210. The disabling may be during a period of time in which the estimated control signal is being determined (e.g., analog control is not being performed based on CLK_IN and CLK_PLL).

In an example of operation of the PLL 104, the frequency search circuit 202 receives CLK_IN and provides an estimated control code based on CLK_IN, CLK_PLL, a first control code, a second control code, and a programmed, or target, frequency (Freq_target). The first control code and the second control code are, in some examples, programmed at a time of manufacture of the PLL 104. In other examples, the first control code and the second control code are programmable, such that a user may provide the first control code and the second control code and store the control codes to the frequency search circuit 202. Operation of the frequency search circuit 202 to provide the estimated control code is described below with respect to FIG. 3. In an example, the frequency search circuit 202 provides an enable signal having an asserted value at its first output responsive to the estimated control code not yet having been determined, and provides the enable signal having a deasserted value at its first output responsive to the estimated control code having been determined and being provided at its second output.

As described above, in some examples, responsive to the frequency search circuit 202 providing the enable signal having the asserted value, the PFD 206, charge pump 208, and filter 210 may be disabled. The PFD 206, charge pump 208, and filter 210 may consume less power while disabled than while enabled, decreasing power consumption of the PLL 104. In an example, the filter 210 provides a fixed bias voltage responsive to being disabled. For example, responsive to being disabled, the filter 210 may provide a bias voltage that is an output of a voltage divider coupled between a power supply and ground. The voltage divider may have any suitable voltage divider ratio for providing the fixed bias voltage having a value suitable for an application environment of the PLL 104. Responsive to the filter 210 receiving the enable signal having a deasserted value, the voltage divider may be disabled and providing of the fixed bias voltage terminated.

Responsive to the enable signal having a deasserted value, the divider 204 provides CLK_REF based on CLK_IN and a divide value of the divider 204. Although the divider 204 is shown as a single divider, in various examples, the divider 204 may be implemented as multiple dividers cascaded serially. The PFD 206 receives CLK_REF and compares CLK_REF to an output of the divider 216. The output of the divider 216 has an integer relationship to CLK_PLL, as described above. Based on the comparison, the PFD 206 provides a control signal to the charge pump 208. For example, responsive to F_ref being greater than a frequency of the output signal of the divider 216 the PFD 206 provides a control signal to the charge pump 208 operable to cause the charge pump 208 to increase a value of a control signal provided for controlling the oscillator 212. Similarly, responsive to F_ref being less than a frequency of the output signal of the divider 216 the PFD 206 provides a control signal to the charge pump 208 operable to cause the charge pump 208 to decrease the value of the control signal provided for controlling the oscillator 212. The PFD 206 may perform the phase and/or frequency comparison according to any suitable hardware architecture, software process, or combination thereof.

Based on the control signal provided by the PFD 206, the charge pump 208 may be operable to provide a control signal for controlling the oscillator 212. For example, the charge pump 208 may receive the output signal of the PFD 206 and provide a control signal having a value proportional to a value of the output signal of the PFD 206. In some examples, the control signal provided by the charge pump 208 has a current proportional, or otherwise related, to the value of the output signal of the PFD 206. The filter 210 receives the control signal and provides an analog control signal to the oscillator 212. The analog control signal is provided, for example, by the filter 210 filtering the control signal received from the charge pump 208.

The oscillator 212 may be operable to provide an output signal having a frequency proportional to a value of the estimated control code and the analog control signal. For example, a frequency of the output signal of the oscillator 212 may be proportional, or have another relationship, such as a linear relationship, to a value of the estimated control code and the analog control signal. In some examples, the PLL 104 includes an additional divider (not shown) following the buffer 214, such that the output signal of the oscillator 212 may be divided by the divider to form CLK_PLL having frequency F_PLL. The dividing may be by any suitable divide value based on an application environment of the PLL 104, such as a divide value of 1, 2, 4, 8, or any other suitable value. The output signal of the oscillator 212 may be divided by the divider 216 to form a feedback signal for providing to the PFD 206, as described above. In an example, the analog control loop of the PLL 104 is configured to control the oscillator 212 to provide CLK_PLL having F_PLL determined according to equation 1, as shown below, in which D1 is a divide value of the divider 204 and D2 is a divide value of the divider 216.

$$F\_PLL = \left(\frac{F\_IN}{D1}\right) * D2 \qquad (1)$$

Figure 3:
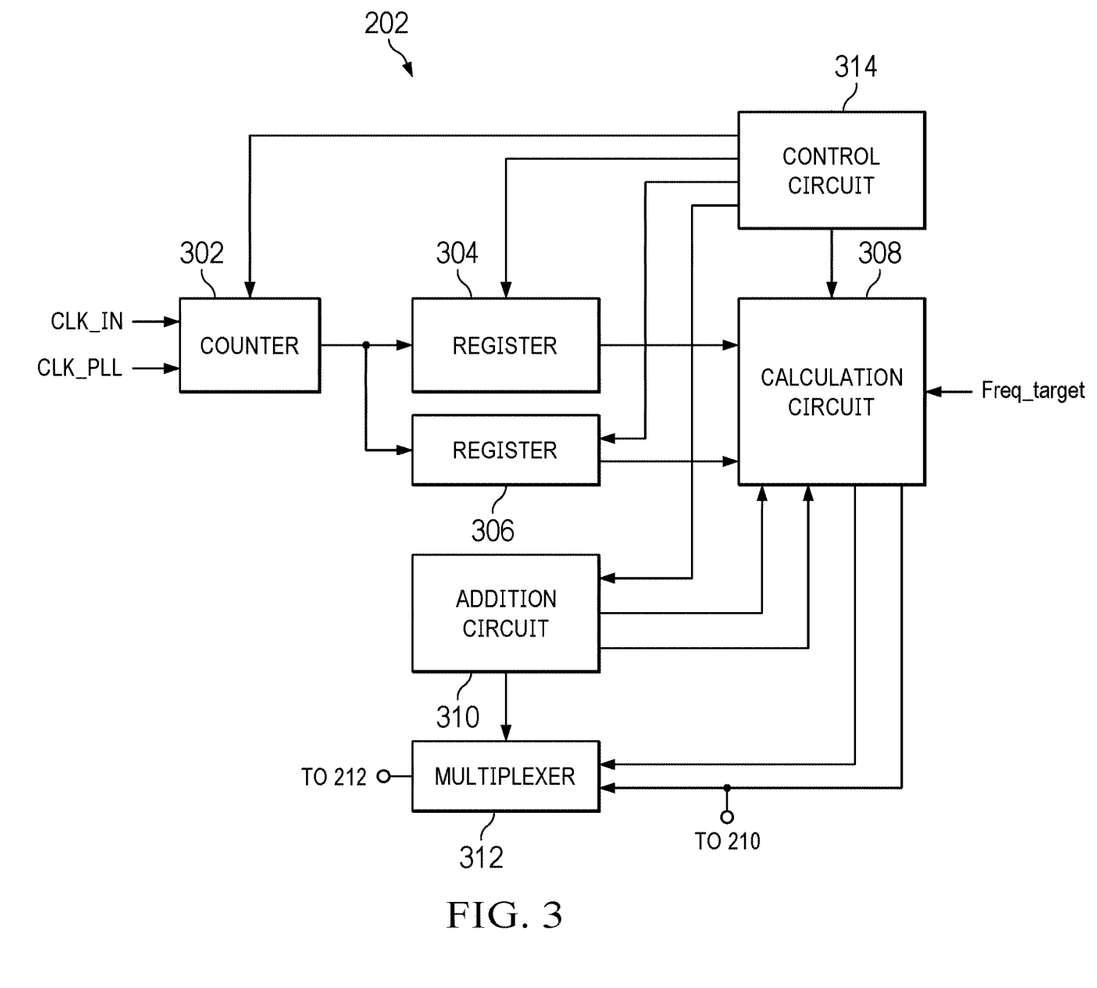
FIG. 3 is a block diagram of a frequency search circuit, in accordance with various examples.

FIG. 3 is a block diagram of the frequency search circuit 202, in accordance with various examples. The frequency search circuit 202 includes a counter 302, a register 304, a register 306, a calculation circuit 308, an addition circuit 310, a multiplexer 312, and a control circuit 314. In an example architecture of the frequency search circuit 202, the counter 302 has a first input configured to receive CLK_IN, a second input configured to receive CLK_PLL (e.g., coupled to the output of the buffer 214), a third input coupled to a first output of the control circuit 314, and an output. The register 304 has a first input coupled to the output of the counter 302, a second input coupled to a second output of the control circuit 314, and an output. The register 306 has a first input coupled to the output of the counter 302, a second input coupled to a third output of the control circuit 314, and an output. The calculation circuit 308 has a first input coupled to the output of the register 304, a second input coupled to the input of the register 306, a third input coupled to a fourth output of the control circuit 314, a fourth input configured to receive Freq_target, a fifth input, a sixth input, a first output, and a second output. The addition circuit 310 has an input, a first output coupled to the fifth input of the calculation circuit 308, a second output coupled to the sixth input of the calculation circuit 308, and a third output. The multiplexer 312 has a first input coupled to the third output of the addition circuit 310, a second input coupled to the first output of the calculation circuit 308, a third input coupled to the second output of the calculation circuit 308, and an output.

In an example of operation of the frequency search circuit 202, the counter 302 receives CLK_IN and CLK_PLL. The control circuit 314 monitors CLK_IN and provides control signals to various components of the frequency search circuit 202, as described herein. The control circuit 314 may have any suitable architecture including analog and/or digital components suitable for providing control signals as described herein. Further, the control circuit 314 may operate according to any suitable methodology for providing control signals having values or states as described herein, the scope of which is not limited. Responsive to assertion of a control signal received at the third input of the counter 302 from the control circuit 314, the counter 302 counts a number of rising edges in CLK_PLL for a programmed number of clock cycles of CLK_IN. In an example, the programmed number of CLK_IN clock cycles is 10. In other examples, the number of clock cycles may be less than or greater than 10, based on a determined trade-off in an application environment of the PLL 104 between accuracy of frequency measurement and time consumed in performing the frequency measurement. In an example, CLK_PLL is provided by the oscillator 212 according to a first control code, provided by the addition circuit 310 via the multiplexer 312. Responsive to assertion of a control signal received at the second input of the register 304, the register 304 stores an output value provided by the counter 302. The control circuit 314 subsequently controls the addition circuit to provide a second control code and resets the counter 302. Responsive to the reset, the counter 302 counts a second number of rising edges in CLK_PLL for the programmed number of clock cycles of CLK_IN. In an example, during this time CLK_PLL is provided by the oscillator 212 according to the second control code, provided by the addition circuit 310 via the multiplexer 312. Responsive to assertion of a control signal received at the second input of the register 306, the register 306 stores an output value provided by the counter 302.

Responsive to both the register 304 and the register 306 having stored respective values provided by the counter 302 in response to CLK_PLL being provided according to the first and second control codes, respectively, the control circuit 314 controls the calculation circuit 308 to perform a calculation. In an example, the calculation circuit 308 includes any analog and/or digital circuitry suitable for performing mathematical calculations, such as equations 2 and 3, as described below. In some examples, the calculation circuit 308 is a floating point calculation circuit. To perform the calculation, the calculation circuit 308 obtains the values stored by the registers 304 and 306, Freq_target, a first control code (e.g., Mcode1) from the addition circuit 310, and an offset value (e.g., Mcode_offset) from the addition circuit 310 that represents the delta between the first control code and the second control code. Based on the received values, the calculation circuit 308 determines a value of a slope of a line intersecting the first value of F_PLL and the second value of F_PLL. For example, the calculation circuit 308 determines the slope according to the following equation 2, in which Freq1 is representative of the first value of F_PLL (e.g., as stored in the register 304), Freq2 is representative of the second value of F_PLL (e.g., as stored in the register 306), Mcode_offset is the value received from the addition circuit 310 and added to Mcode1 (e.g., the first control code) to form Mcode2 (e.g., the second control code) which causes the oscillator 212 to provide CLK_PLL having frequency Freq2, and K is the slope.

$$K = \frac{(Freq2 - Freq1)}{Mcode\_offset} \quad (2)$$

By determining the slope, an estimated control code, Mcode_new, may be determined according to the following equation 3, in which Freq_target is representative of the programmed frequency for CLK_PLL (e.g., target value for F_PLL) and Mcode1 is the control code received from the addition circuit 310 and which causes the oscillator 212 to provide CLK_PLL having frequency Freq1. In an example, Freq_target is representative of a target count of a number of rising edges of CLK_PLL during 10 clock cycles of CLK_IN.

$$Mcode\_new = K \cdot (Freq\_target - Freq1) + Mcode1 \quad (3)$$

Prior to determination of Mcode_new, the calculation circuit 308 provides an enable signal at the second output of the calculation circuit 308 having an asserted value, indicating that Mcode_new is not yet available. Responsive to the calculation circuit 308 determining and providing Mcode_new, the calculation circuit 308 provides the enable signal having a deasserted value.

The multiplexer 312 is configured to provide an output signal of the addition circuit 310 to the oscillator 212 for performing the measurements of F_PLL for use in determining Mcode_new, and provide Mcode_new to the oscillator 212 responsive to the determination and providing of Mcode_new. Accordingly, the multiplexer 312 receives the enable signal from the calculation circuit 308 as a select signal of the multiplexer 312. For example, responsive to the enable signal having a value of zero, the multiplexer 312 provides a signal received from the addition circuit 310 at the output of the multiplexer 312. Responsive to the enable signal having a value of one, the multiplexer 312 provides a signal received from the calculation circuit 308 at the output of the multiplexer 312.

In an example, the addition circuit 310 provides the first control code and the second control code, as described above, to the multiplexer 312. In an example, the addition circuit 310 includes registers (not shown) storing the first and second control code, or values suitable for determining the first or second control code, and selectively provides the first or second control code to the multiplexer 312 based on the contents of these registers. An example implementation of the addition circuit 310 is described in detail below.

Figure 4:
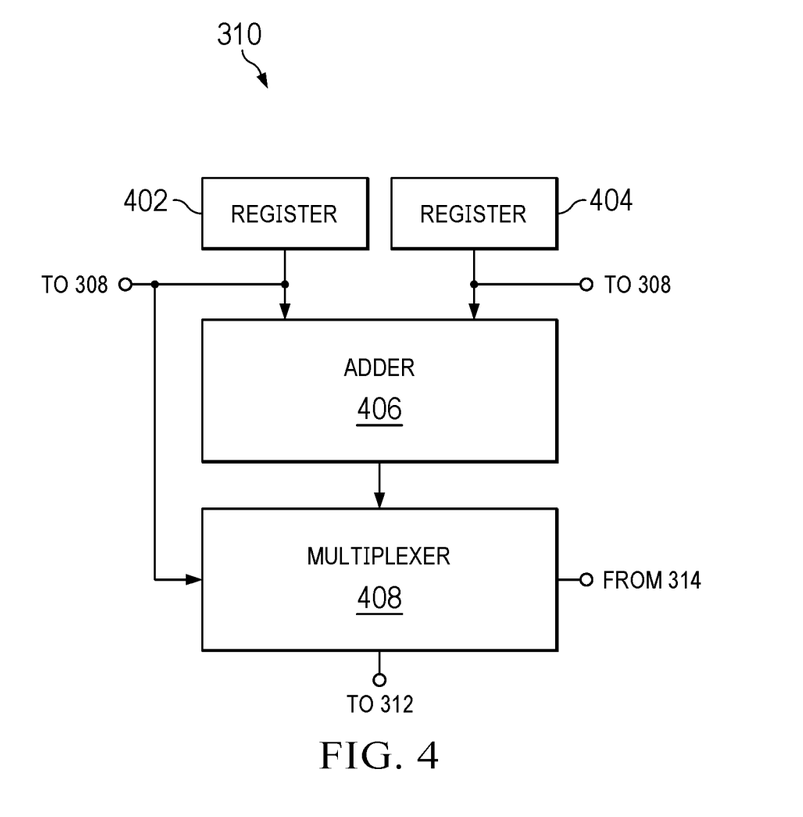
FIG. 4 is a block diagram of an addition circuit, in accordance with various examples.

FIG. 4 is a block diagram of the addition circuit 310, in accordance with various examples. In an example, the addition circuit 310 includes a register 402, a register 404, an adder 406, and a multiplexer 408. In an example, the register 402 is configured to store the first control code (e.g., Mcode1), as described above. The register 404 is configured to store an offset value (e.g., Mcode_offset), which when added to the first control code, forms the second control code (e.g., Mcode2), as described above. The adder 406 has a first input coupled to an output of the register 402, a second input coupled to an output of the register 404, and an output. The multiplexer 408 has a first input coupled to the output of the register 402, a second input coupled to the output of the adder 406, a select input coupled to the control circuit 314, and an output. In an example, the output of the multiplexer 408 is the output of the addition circuit 310.

In an example of operation of the addition circuit 310, responsive to a select signal received from the control circuit 314 having an asserted value (e.g., a value of one), the addition circuit 310 provides a value stored in the register 402 as an output signal of the addition circuit 310. Responsive to the select signal having a deasserted value (e.g., a value of zero), the addition circuit 310 provides an output signal of the adder 406 as the output signal of the addition circuit 310. In an example, the select signal has the asserted value while determining Freq1, as described above, and has the deasserted value while determining Freq2, also as described above.

Figure 5:
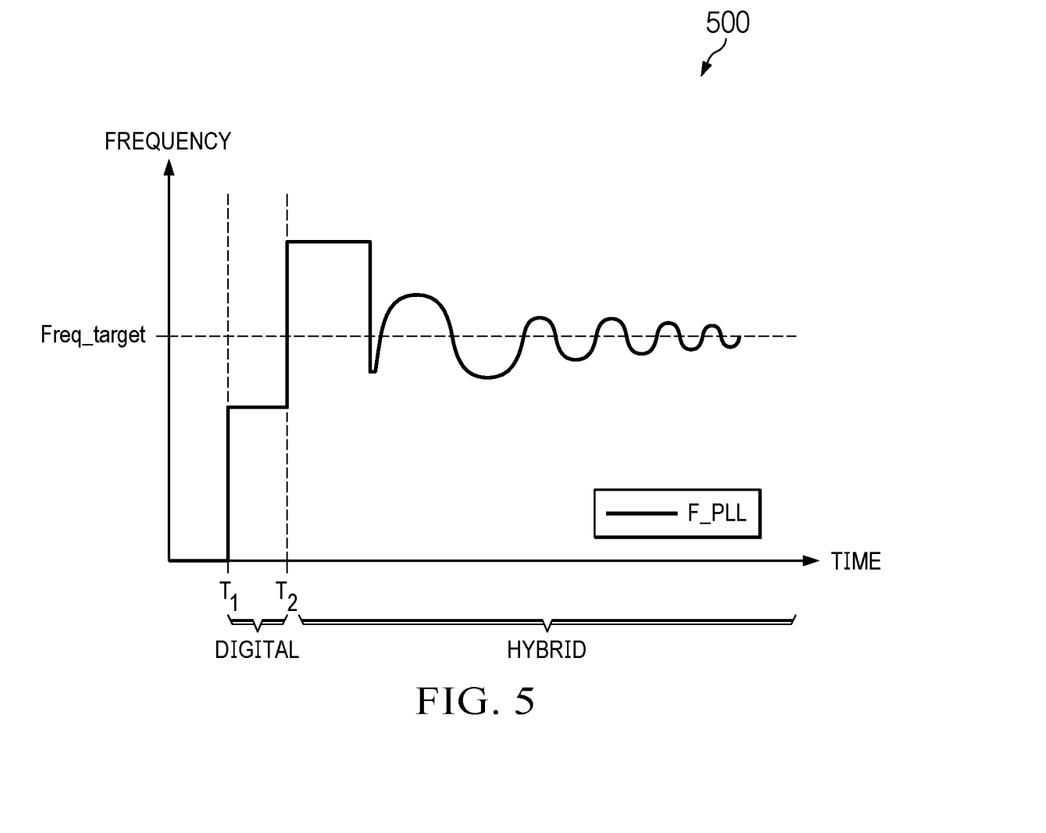
FIG. 5 is a timing diagram of signals, in accordance with various examples.

FIG. 5 is a timing diagram 500 of signals, in accordance with various examples. In at least some examples, the signals represented in the diagram 500 are signals of, or related to, the PLL 104 as described above. Accordingly, reference may be made to components or signals of the PLL 104, as described above with reference to other figures herein. The diagram 500 includes Freq_target and F_PLL. A horizontal axis of FIG. 5 is representative of time and a vertical axis of FIG. 5 is representative of frequency.

As shown in the diagram 500, F_PLL is provided during a first period of time according to digital control and during a second period of time according to hybrid control. The hybrid control is, for example, analog control to refine or converge a result of the digital control to Freq_target. At a time t1, a first control code (e.g., Mcode1) is applied to the oscillator 212 to cause F_PLL to have a first value (e.g., Freq1). At a time t2, a second control code (e.g., Mcode2) is applied to the oscillator 212 to cause F_PLL to have a second value (e.g., Freq2). The PLL 104 determines an estimated control code (e.g., Mcode_new) and applies the estimated control code to the oscillator 212 to cause F_PLL to have a third value. In an example, the value is within a threshold frequency variance of Freq_target. In some implementations, that threshold frequency variance is 12.5%. Subsequent, and responsive, to application of the estimated control code to the oscillator 212, the hybrid control begins. During the hybrid control, the oscillator 212 is controlled according to both the estimated control code and an analog control signal. Based on the analog control signal, determined and provided as described above with respect to the analog control loop of the PLL 104, the oscillator 212 is controlled to provide F_PLL having a fourth value that is, or converging the third value of F_PLL via closed loop control to be, equal to Freq_target.

Figure 6:
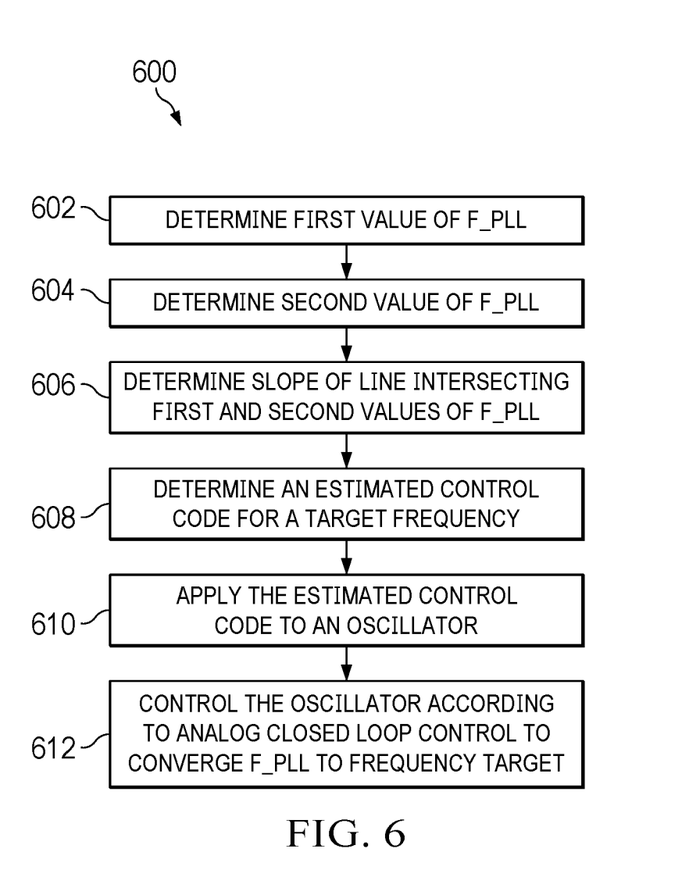
FIG. 6 is a flow diagram of a method of operation of a PLL, in accordance with various examples.

FIG. 6 is a flow diagram of a method 600 of operation of a PLL, in accordance with various examples. In at least some examples, the PLL is the PLL 104. Accordingly, reference may be made to components or signals of the PLL 104, as described above with reference to other figures herein. In some examples, the PLL is operable to provide a signal, such as a clock signal (e.g., CLK_PLL) for synchronizing operation of some other component(s). To provide the clock signal, an oscillator of the PLL is controlled according to digital open loop control and analog closed loop control. In at least some examples, the method 600 is implemented by the PLL, such as by a frequency search circuit, such as the frequency search circuit 202, and an analog control loop, as described above.

At operation 602, a first value of F_PLL is determined. In an example, the first value of F_PLL (e.g., Freq1) is determined by controlling the oscillator 212 to provide CLK_PLL according to a first control code (e.g., Mcode1). The value of F_PLL may be determined by counting a number of rising edges in CLK_PLL for a programmed duration of time, such as for a programmed number of clock cycles of CLK_IN. In some examples, the number of clock cycles is 10. The first value of F_PLL may be stored in a register for subsequent use.

At operation 604, a second value of F_PLL is determined. In an example, the second value of F_PLL (e.g., Freq2) is determined by controlling the oscillator 212 to provide CLK_PLL according to a second control code (e.g., Mcode2). In some examples, controlling the oscillator to provide CLK_PLL according to the second control code includes adding an offset value to the first control code to form the second control code. The second value of F_PLL may be stored in a register for subsequent use. In an example, a delay is implemented between operation 602 and operation 604 to facilitate settling of signal values in the PLL 104. In some implementations, that delay is 5 clock cycles of CLK_IN.

At operation 606, a slope of a line intersecting the first value of F_PLL and the second value of F_PLL is determined. The slope may be determined according to any suitable process and by any suitable component, such as a processor, a controller, a mathematics circuit, or any other suitable combination of digital and/or analog components. In an example, the slope is determined according to equation 2, as described above.

At operation 608, an estimated control signal for a target frequency is determined. In an example, the estimated control signal (e.g., Mcode_new) is determined by a same component or circuit that determines the slope at operation 606. The estimated control signal is, as described above, for controlling the oscillator 212 to provide CLK_PLL such that F_PLL is within the threshold frequency variance of a frequency corresponding to Freq_target. In an example, the estimated control signal is determined according to equation 3, as described above.

At operation 610, the estimated control signal is applied to the oscillator 212. In an example, applying the estimated control signal to the oscillator 212 causes the oscillator 212 to provide CLK_PLL such that F_PLL is within the threshold frequency variance of Freq_target.

At operation 612, the oscillator 212 is controlled according to analog closed loop control, as described above, to converge a value of F_PLL to equal Freq_target.

In this description, the term "couple" may cover connections, communications or signal paths that enable a functional relationship consistent with this description. For example, if device A provides a signal to control device B to perform an action, then: (a) in a first example, device A is directly connected to device B; or (b) in a second example, device A is coupled to device B through intervening component C if intervening component C does not alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A phase-locked loop (PLL) circuit, comprising:
   an oscillator configured to provide a clock signal;
   a frequency search circuit configured to:
   measure a first frequency of the clock signal, the first frequency associated with a first code;
   measure a second frequency of the clock signal, the second frequency associated with a second code;
   determine, based on the first frequency, the second frequency, the first code, and the second code, a slope value;
   determine a third code based on the slope value and a target frequency; and
   provide the third code to the oscillator; and
   an analog control loop configured to control the oscillator to cause a frequency of the clock signal to converge to the target frequency.

2. A phase-locked loop (PLL) circuit, comprising:
   an oscillator configured to provide a clock signal;
   a frequency search circuit configured to:
   measure a first frequency of the clock signal for a first clock control signal;
   measure a second frequency of a second signal for a second clock control signal; and
   determine, based on the first frequency, the second frequency, the first clock control signal, and the second clock control signal, a third clock control signal corresponding to a programmed frequency, the third clock control signal for causing the clock signal to have a frequency based on the programmed frequency; and
   an analog control loop configured to control the oscillator to cause a frequency of the clock signal to converge to the programmed frequency, wherein the frequency search circuit includes:
   a counter configured to count a number of rising edges occurring in the clock signal for a programmed number of cycles of a reference clock;
   a first register configured to store a first output value of the counter, the first output value indicating the first frequency;
   a second register configured to store a second output value of the counter, the second output value indicating the second frequency;
   a calculation circuit configured to determine and provide the third clock control signal, and provide an enable signal indicating that the third clock control signal has been determined;
   a third register configured to store the first clock control signal;
   a fourth register configured to store a clock offset value, the second clock control signal determinable by adding the clock offset value to the first clock control signal;
   an addition circuit configured to selectively provide an addition output including the first clock control signal or the second clock control signal; and
   a multiplexer configured to selectively provide the addition output or the third clock control signal to the oscillator based on a value of the enable signal to cause the oscillator to provide the clock signal.

3. The PLL circuit of claim 2, wherein the addition circuit includes:
   an adder configured to add the clock offset value and the first clock control signal to form the second clock control signal; and
   a second multiplexer configured to selectively provide the addition output as the first clock control signal or the second clock control signal.

4. The PLL circuit of claim 2, wherein the analog control loop is disabled during determination of the third clock control signal, and wherein the frequency search circuit is configured to enable the analog control loop responsive to assertion of the enable signal.

5. The PLL circuit of claim 4, wherein responsive to being disabled, the analog control loop is configured to bias the oscillator based on a value of a supply voltage of the PLL circuit.

6. The PLL circuit of claim 2, wherein the third clock control signal causes the oscillator to provide the clock signal having a frequency within 25 percent of the programmed frequency.

7. The PLL circuit of claim 6, wherein the third clock control signal causes the oscillator to provide the clock signal having a frequency within 12.5 percent of the programmed frequency.

8. The PLL circuit of claim 7, wherein the analog control loop causes the frequency to converge to the programmed frequency based on closed loop control of the oscillator based on the clock signal and a reference clock.

9. An apparatus, comprising:
   a counter having a reference input, a clock input, and a counter output, wherein the counter is configured to count a number of rising edges occurring in a clock signal received at the clock input for a programmed number of cycles of a reference clock received at the reference input;
   a first register having a first register input and a first register output, the first register input coupled to the counter output, wherein the first register is configured to store a first output value of the counter;
   a second register having a second register input and a second register output, the second register input coupled to the counter output, wherein the second register is configured to store a second output value of the counter;
   a calculation circuit having a first operand input, a second operand input, a calculation output, and a status output, the first operand input coupled to the first register output, and the second operand input coupled to the second register output, wherein the calculation circuit is configured to provide a control signal having a value determined based on the first output value and the second output value, the control signal to control an oscillator to provide the clock signal having a frequency within a margin of error of a programmed value;
   a third register having a third register output;
   a fourth register having a fourth register output;
   an addition circuit having a first addition input, a second addition input, and an addition output, the first addition input coupled to the third register output, and the second addition input coupled to the fourth register output; and
   a multiplexer having a first multiplexer input, a second multiplexer input, a selection input, and a multiplexer output, the first multiplexer input coupled to the addition output, the second multiplexer input coupled to the calculation output, and the selection input coupled to the status output.

10. The apparatus of claim 9, wherein the counter has a reset input, the first register has a first enable input, the second register has a second enable input, and the addition circuit has a register selection input, the apparatus further comprising control logic having a first control logic output coupled to the reset input, a second control logic output coupled to the first enable input, a third control logic output coupled to the second enable input, and a fourth control logic output coupled to the register selection input.

11. The apparatus of claim 10, wherein the addition circuit includes:
   an adder circuit having a first adder input, a second adder input, and an adder output, the first adder input coupled to the third register output, and the second adder input coupled to the fourth register output; and
   a second multiplexer, the second multiplexer having a third multiplexer input, a fourth multiplexer input, a second selection input, and a second multiplexer output, the third multiplexer input coupled to the third register output, the fourth multiplexer input coupled to the adder output, the second selection input coupled to the fourth control logic output, and the second multiplexer output coupled to the first multiplexer input.

12. The apparatus of claim 11, wherein the control logic is configured to implement a state machine to determine values for respective control signals provided at the first, second, third, and fourth control logic outputs.

13. The apparatus of claim 9, further comprising an oscillator having an oscillator input and an oscillator output, the oscillator input coupled to the multiplexer output, and the oscillator output coupled to the clock input, wherein the oscillator is configured to provide the clock signal at the oscillator output.

14. The apparatus of claim 9, wherein the margin of error is no greater than 12.5%.

15. A method, comprising:
performing open loop control of an oscillator providing a clock signal, wherein performing open loop control of the oscillator comprises:
   measuring a first frequency of the clock signal, the first frequency associated with a first clock control code;
   measuring a second frequency of the clock signal, the second frequency associated with a second clock control code;
   determining, based on the first frequency, the second frequency, the first clock control code, and the second clock control code, a slope value;
   determining a third clock control code based on the slope value and a target frequency;
   providing the third clock control code to the oscillator; and
after providing the third clock control code to the oscillator, performing closed loop control of the oscillator to cause the clock signal to converge to the target frequency.

16. The method of claim 15, further comprising determining the second clock control code by adding an offset value to the first clock control code.

17. The method of claim 15, wherein the clock signal corresponding to the third clock control code is within a threshold frequency variance of the target frequency.

18. The method of claim 15, further comprising measuring the first frequency by counting a number of rising edges in the clock signal for a programmed period of time.

19. The method of claim 18, wherein the programmed period of time is a number of clock cycles of a reference clock.

20. The method of claim 19, wherein the clock signal has an integer relationship to the reference clock.

* * * * *